(12) United States Patent
Bueti et al.

(10) Patent No.: US 8,291,357 B2
(45) Date of Patent: *Oct. 16, 2012

(54) ON-CHIP IDENTIFICATION CIRCUIT INCORPORATING PAIRS OF CONDUCTORS, EACH HAVING AN ESSENTIALLY RANDOM CHANCE OF BEING SHORTED TOGETHER AS A RESULT OF PROCESS VARIATIONS

(75) Inventors: Serafino Bueti, Waterbury, VT (US); Adam J. Courchesne, Jericho, VT (US); Kenneth J. Goodnow, Essex Junction, VT (US); Todd E. Leonard, Williston, VT (US); Peter A. Sandon, Essex Junction, VT (US); Peter A. Twombly, Shelburne, VT (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 1294 days.

This patent is subject to a terminal disclaimer.

(21) Appl. No.: 11/869,179

(22) Filed: Oct. 9, 2007

(65) Prior Publication Data

US 2009/0091351 A1    Apr. 9, 2009

(51) Int. Cl.
G06F 9/45    (2006.01)

(52) U.S. Cl. ........ 716/103; 716/100; 716/101; 716/110; 716/119; 716/138; 324/635; 257/212; 257/734; 326/101; 326/104; 380/39; 380/44; 380/277

(58) Field of Classification Search ................ 380/44
See application file for complete search history.

(56) References Cited

U.S. PATENT DOCUMENTS

| | | | |
|---|---|---|---|
| 6,150,231 A | 11/2000 | Muller et al. | |
| 6,549,447 B1 | 4/2003 | Fricke et al. | |
| 6,559,796 B1 | 5/2003 | Huber et al. | |
| 7,030,651 B2 | 4/2006 | Madurawe | |
| 7,253,659 B2 | 8/2007 | Madurawe | |
| 7,323,905 B2 | 1/2008 | Madurawe | |
| 7,725,844 B2 | 5/2010 | Aipperspach et al. | |
| 7,941,769 B1 | 5/2011 | Hu | |
| 2003/0042431 A1* | 3/2003 | Clevenger et al. | 250/492.21 |
| 2004/0222817 A1 | 11/2004 | Madurawe | |

OTHER PUBLICATIONS

Bueti et al., U.S. Appl. No. 12/105,883, Office Action Communication, Jun. 30, 2011, 9 pages.
U.S. Appl. No. 12/105,883, Office Action Communication Dated Dec. 23, 2011, 15 pages.

* cited by examiner

*Primary Examiner* — Nathan Flynn
*Assistant Examiner* — Bryan Wright
(74) *Attorney, Agent, or Firm* — Gibb & Riley, LLC

(57) ABSTRACT

Disclosed are embodiments of on-chip identification circuitry. In one embodiment, pairs of conductors (e.g., metal pads, vias, lines) are formed within one or more metallization layers. The distance between the conductors in each pair is predetermined so that, given known across chip line variations, there is a random chance (i.e., an approximately 50/50 chance) of a short. In another embodiment different masks form first conductors (e.g., metal lines separated by varying distances and having different widths) and second conductors (e.g., metal vias separated by varying distances and having equal widths). The first and second conductors alternate across the chip. Due to the different separation distances and widths of the first conductors, the different separation distances of the second conductors and, random mask alignment variations, each first conductor can short to up to two second conductors. In each embodiment the resulting pattern of shorts and opens, can be used as an on-chip identifier or private key.

20 Claims, 7 Drawing Sheets

ON-CHIP IDENTIFICATION CIRCUIT INCORPORATING PAIRS OF CONDUCTORS, EACH HAVING AN ESSENTIALLY RANDOM CHANCE OF BEING SHORTED TOGETHER AS A RESULT OF PROCESS VARIATIONS

BACKGROUND

1. Field of the Invention

The embodiments of the invention generally relate to on-chip identification circuitry and, more particularly, to improved on-chip identification circuitry that does not incorporate fuses and/or anti-fuses.

2. Description of the Related Art

Integrated circuit chips often require unique on-chip identifiers. Typically, such identifiers are formed by providing on-chip fuses and/or anti-fuses, which are programmed (i.e., blown) at test. Blowing fuses and/or anti-fuses at test increases testing time and, thereby, increases chip manufacturing costs. Furthermore, these devices consume a relatively large amount of chip space (e.g., approximately 7.3 $\mu m^2$). Thus, there is a need in the art for on-chip identification circuitry that does not incorporate fuses and/or anti-fuse in order to conserve chip space, manufacturing time and costs.

Additionally, integrated circuit chips that have cryptography functions often require private keys. Such private keys are typically produced using complicated methods in which random numbers are generated based on thermal-noise, metastability, radioactive elements, etc. Thus, there is a need in the art for a non-complicated cost-saving technique for creating private keys.

SUMMARY

In view of the foregoing disclosed herein are embodiments of improved on-chip identification circuitry. The disclosed embodiments take advantage of across chip line variations (ACLV) and, optionally, random mask alignment variations to provide a unique on-chip identifier and/or a private key. In one embodiment, pairs of adjacent conductors (e.g., metal pads, vias, lines, etc.) are formed within one or more of the chip metallization layers. The distance between the conductors in each pair is predetermined so that, given known ACLVs, there will be a random chance (i.e., a 50% chance) that the conductors will short together. In another embodiment different masks can be used to form first conductors (e.g., metal lines separated by varying distances and having different widths) and second conductors (e.g., metal vias separated by varying distances, but having approximately equal widths). The first and second conductors can alternate across the chip. Due to the different separation distances and the different widths of the first conductors, due to the different separation distances of the second conductors and, due to random mask alignment variations between the masks during fabrication, each of the first conductors has an approximately random potential to short to up to two of the second conductors. In each embodiment, a resulting pattern of shorts, as indicated by one logic value, and opens, as indicated by an opposite logic value, can be used as an on-chip identifier or private key.

More particularly, one embodiment of an on-chip identification circuit takes advantage of known across chip line variations (ACLVs) in order to provide an on-chip identifier or private key. This embodiment of the identification circuit comprises multiple pairs of conductors on the chip. Each pair of conductors comprises a first conductor, a second conductor adjacent to the first conductor, and either a short or an open between the first and second conductors. The identification circuit is designed to ensure that the existence of a short or an open in each of the pairs of conductors is random. Specifically, each pair of conductors is designed so that the first conductor and the second conductor in each pair are separated by the same distance and this distance is predetermined, in light of known ACLV effects, so that for any given pair of conductors there is a random chance that the given pair will comprise either a short or an open (i.e., there is an approximately 50% chance that the given pair will comprise a short and an approximately 50% chance that the given pair will comprise an open).

A number of different alternative pair configurations can be used for the first and second conductors in this embodiment of the identification circuit. For example, the first and second conductors in each pair can comprise metal structures (e.g., metal shapes, lines, pads, etc.) and these metal structures can be positioned adjacent to each other in a single metallization layer on the chip. In an alternative configuration, the first conductor in each pair can comprise a metal structure (e.g., a metal shape, line, pad, etc.) in a single metallization layer on the chip and the second conductor in each pair can comprise a conductor-filled via that extends vertically between that metallization layer and at least one additional metallization layer on the chip. Additionally, the first conductor can be positioned adjacent to only one side of the second conductor or, alternatively, the first conductor can partially or completely wrap around the second conductor so that at any given point, where the first conductor is adjacent to the second conductor, they will still be separated by the same predetermined distance.

This embodiment of the identification circuit can further comprise a first voltage rail (e.g., a power source) to which the first conductor in each pair is connected and a second voltage rail (e.g., ground) to which the second conductor in each pair is connected. Thus, for each pair the first conductor can comprise the drive side and the second conductor can comprise the sense side. In operation, the power source can pull up the first conductors and ground can pull down the second conductors so that, for any given pair, if a short exists the second conductor will go high (i.e., have a logic value of 1) and if an open exists, the second conductor will go low (i.e., will have a logic value of 0). A pattern of logic values detected at each of the second conductors for all of the multiple pairs of conductors can serve as either an on-chip identifier or a private key. It should be noted that the identification circuit can further comprise one or more switches for connecting the first conductors to the first voltage rail so that the pattern of logic values can be captured on demand, thereby, reducing power consumption by the identification circuit.

Additional features can be incorporated into this embodiment of the identification circuit to prevent the pattern of logic values from changing over time and, thereby, to ensure the identification circuit's effectiveness for use in providing an on-chip identifier or private key. One technique for avoiding pattern variations over time comprises incorporating sense amps into the identification circuit so that any electrical connection below a specified threshold is identified as an open (i.e., a logic value of 0) and not as a short (i.e., a logic value of 1). Another technique for avoiding pattern variations over time comprises performing a burn-in process at test to ensure that any minimal electrical connections (i.e., weak shorts) between the first and second conductors in each pair are broken and, thus, to ensure that in any subsequently captured patterns only relatively strong electrical connections (i.e., strong shorts) are identified. Finally, rather than using a single identification circuit, as described above, to generate the pattern of logic values for the on-chip identifier or a private key, another embodiment of an on-chip identification circuit can comprise multiple individual identification circuits. The multiple identification circuits can be placed across the chip and logically combined. Logically combining (e.g., XORing) the multiple identification circuits to generate the pattern of logic values for the on-chip identifier or private key increases the randomness of the occurrence of 1's and 0's in the pattern of logic values and, thereby, further ensures the identification circuit's effectiveness for use in providing an on-chip identifier or private key.

Another embodiment of an on-chip identification circuit takes advantage of both known across chip line variations (ACLVs) and random mask alignment variations in order to provide an on-chip identifier or private key. This embodiment comprises a plurality of first conductors and a plurality of second conductors. The first conductors comprise metal lines in a single metallization layer on the chip. These metal lines have different widths (i.e., different first widths) and are separated by different distances (i.e., different first distances). The second conductors comprise conductor-filled vias that extend vertically between the single metallization layer (i.e., the metallization layer in which the first conductors are positioned) and at least one additional metallization layer. These second conductors similarly are separated by different distances (i.e., different second distance), but have the same width (i.e., a same second width).

The first conductors and second conductors are formed using separate masks (i.e., a first mask for forming the first conductors and a second different mask for forming the second conductors) such that they are adjacent to each other and, more particularly, such that they alternate across the chip with each first conductor adjacent to at least one second conductor. Shorts or opens exist between adjacent first and second conductors. More particularly, due to the different distances between the first conductors, the different widths of the first conductors, and the different distances between the second conductors and further due to random alignment variations between the masks used for forming the first and second conductors, each of the first conductors has an approximately random potential to short to up to two of the second conductors.

This embodiment of the identification circuit can further comprise a first voltage rail (e.g., a power source) to which the first conductors are connected and a second voltage rail (e.g., ground) to which the second conductors are connected. Thus, the first conductors are on the drive side of the circuit and the second conductors are on the sense side. In operation, the power source can pull up the first conductors and ground can pull down the second conductors so that, at any given second conductor, if a short to a first conductor exists, the second conductor will go high (i.e., have a logic value of 1). If opens to all adjacent first conductors exists, the second conductor will go low (i.e., will have a logic value of 0). A pattern of logic values detected at each of the second conductors can serve as either an on-chip identifier or a private key. It should be noted that the identification circuit can further comprise one or more switches for connecting the first conductors to the first voltage rail so that the pattern of logic values can be captured on demand, thereby, reducing power consumption by the identification circuit.

As with the previously described embodiment, several additional features can be incorporated into this embodiment of the identification circuit in order to prevent the pattern from changing over time and, thereby, to ensure the identification circuit's effectiveness for use in providing an on-chip identifier or private key. For example, sense amps can be connected to the second conductors so that any electrical connection below a specified threshold is identified as an open (i.e., a logic value of 0) and not as a short (i.e., a logic value of 1). A burn-in process can also be performed at test to break any minimal electrical connections (i.e., weak shorts) and, thus, to ensure that in any subsequently captured pattern only relatively strong electrical connections (i.e., strong shorts) are identified. Finally, rather than using a single identification circuit, as described above, to generate the pattern of logic values for the on-chip identifier or a private key, another embodiment of an on-chip identification circuit can comprise multiple individual identification circuits. The multiple identification circuits can be placed across the chip and logically combined (e.g., XORed). Logically combining the multiple identification circuits to generate the pattern of logic values for the on-chip identifier or private key increases the randomness of the occurrence of 1's and 0's in the pattern of logic values and, thereby, further ensures the identification circuit's effectiveness for use in providing an on-chip identifier or private key.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
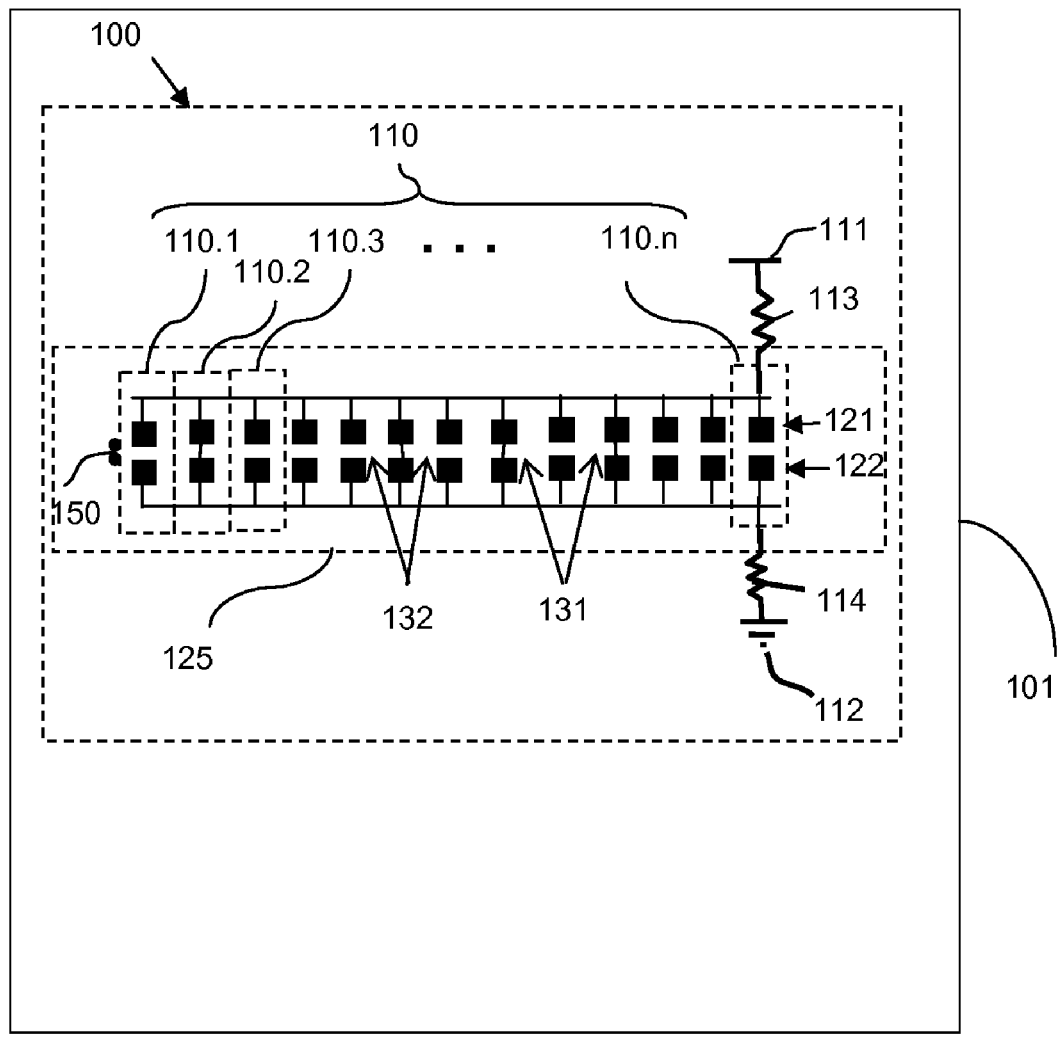
FIG. 1 is a diagram illustrating an embodiment of an identification circuit.
Figure 2:
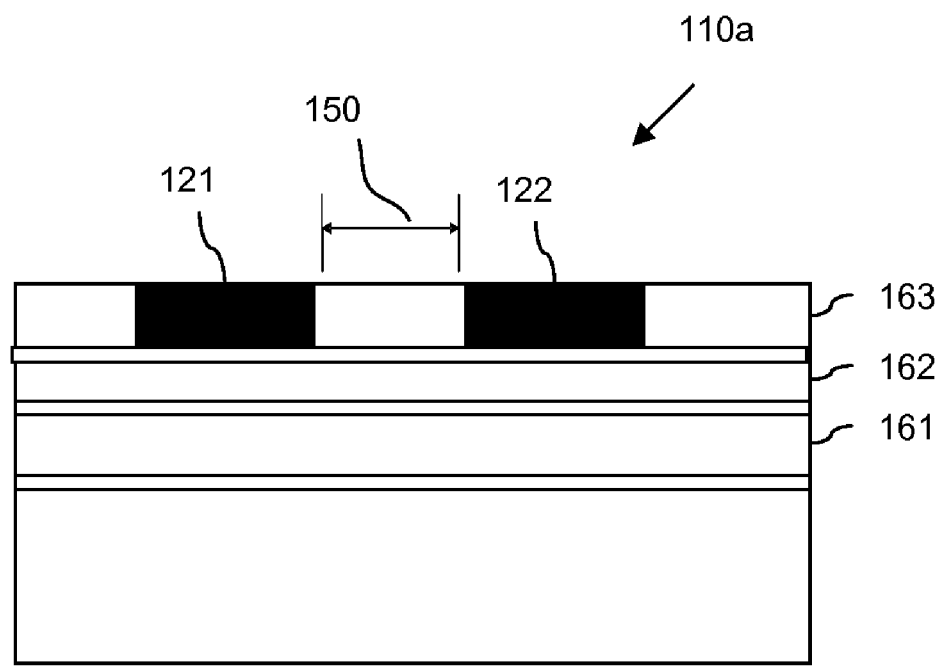
FIG. 2 is a cross-section view diagram illustrating an exemplary configuration for a pair of conductors that can be incorporated into the identification circuit of FIG. 1.
Figure 3:
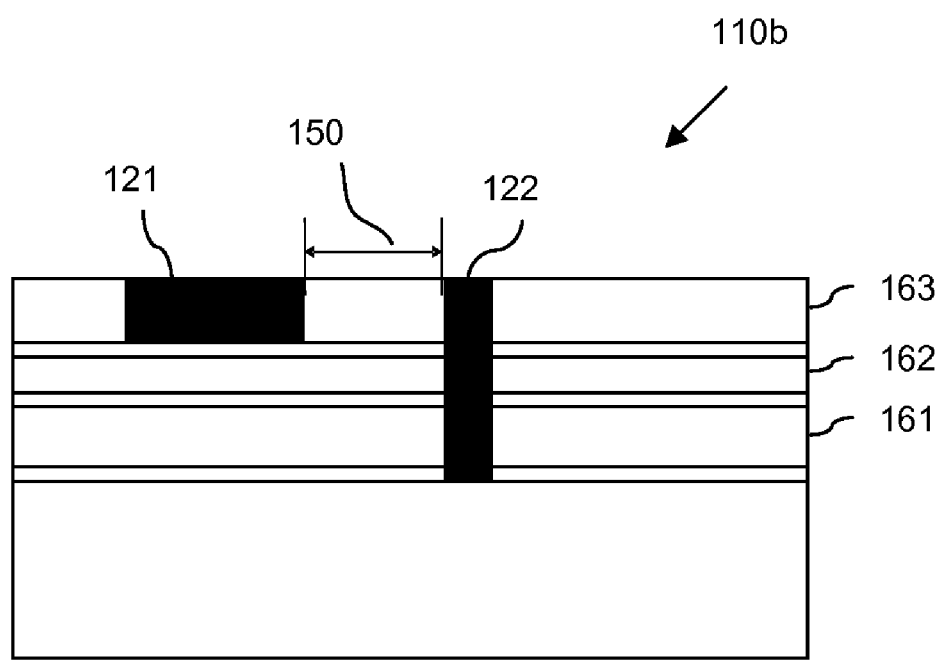
FIG. 3 is a cross-section view diagram illustrating an exemplary configuration for a pair of conductors that can be incorporated into the identification circuit of FIG. 1.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, integrated circuit chips often require unique on-chip identifiers. Typically, such identifiers are formed by providing on-chip fuses and/or anti-fuses, which are programmed (i.e., blown) at test. Blowing fuses and/or anti-fuses at test increases testing time and, thereby, increases chip manufacturing costs. Furthermore, these devices consume a relatively large amount of chip space. Thus, there is a need in the art for on-chip identification circuitry that does not incorporate fuses and/or anti-fuses.

Additionally, integrated circuit chips that have cryptography functions often require private keys. Such private keys are typically produced using complicated methods in which random numbers are generated by random number generators based on thermal-noise, meta-stability, radioactive elements, etc. Thus, there is a need in the art for a non-complicated technique for creating private keys.

Therefore, disclosed herein are embodiments of improved on-chip identification circuitry. The disclosed embodiments take advantage of across chip line variations (ACLV) and, optionally, random mask alignment variations to provide a unique on-chip identifier and/or a private key. In one embodiment, pairs of adjacent conductors (e.g., metal shapes, pads, vias, lines, etc.) are formed within one or more of the chip metallization layers. The distance between the conductors in each pair is predetermined so that, given known ACLVs, there will be a random chance (i.e., an approximately 50% chance) that the conductors will short together. In another embodiment different masks can be used to form first conductors (e.g., metal lines separated by varying distances and having different widths) and second conductors (e.g., metal vias separated by varying distances, but having approximately equal widths). The first and second conductors can alternate across the chip. Due to the different separation distances and the different widths of the first conductors, due to the different separation distances of the second conductors and, due to random mask alignment variations between the masks during fabrication, each of the first conductors has an approximately random potential to short to up to two of the second conductors. In each embodiment, a resulting pattern of shorts, as indicated by one logic value, and opens, as indicated by an opposite logic value, can be used as an on-chip identifier or private key.

More particularly, referring to FIG. 1, one embodiment of an on-chip identification circuit 100 takes advantage of known across chip line variations (ACLVs) in order to provide a pattern of logic values that can serve as either an on-chip identifier or private key. This embodiment comprises a set 125 of multiple pairs 110 of conductors on the chip 101. Each pair 110.1-110.n in the set 125 comprises a first conductor 121, a second conductor 122 adjacent to the first conductor 121, and either a short 131 (i.e., an electrical connection) or an open 132 (i.e., no electrical connection) between the first and second conductors 121-122. The identification circuit 100 is designed to ensure that the existence of a short 131 or an open 132 in each of the pairs 110.1-110.n of conductors is random.

Specifically, each pair 110.1-110.n of conductors is designed so that the first conductor 121 and the second conductor 122 in each pair 110 are separated by the same distance 150 and this distance is predetermined, in light of known ACLV effects, so that for any given pair (e.g., 110.2) of conductors there is a random chance that the given pair will comprise a short 131 or an open 132 (i.e., there is an approximately 50% chance that the given pair will comprise a short 131 and an approximately 50% chance that the given pair will comprise an open 132). That is, metallization processes during manufacturing inherently result in some variability. Metallization ground rules exist to ensure that two conductive structures (e.g., metal shapes, lines, pads, vias, etc.) formed in one or more of the metallization layers (e.g., M1, M2, M3, etc.) will not short to one another. By placing the conductive structures 121-122 in each pair 110 closer than the minimum distance required to prevent a short, the probability that the two conductors 121-122 will short will increase. At some distance 150 between zero separation and the minimum distance required to prevent a short, there will be a 50/50 chance that the conductive structure. This distance 150 can be predetermined based on the known across chip line variation (ACLV) effects for a given technology. By placing the pairs 110 of conductors around the chip and separating the first and second conductors 121-122 by this predetermined distance 150, some pairs (e.g., 110.2, etc.) will be shorted and others (e.g., 110.1, 110.3, etc.) will be opened.

The first and second conductors 121-122 in the pairs 110 of conductors in this identification circuit 100 can be formed in one or more of the chip metallization layers and can comprise one or more different metal shapes (e.g., metal pads, lines, vias, etc.), as illustrated in FIGS. 2-6. For example, referring to the cross-section diagram of FIG. 2, the first and second conductors 121-122 in an exemplary pair 110a can comprise metal structures (e.g., metal shapes, lines, pads, etc.) that are formed in a single metallization layer 163 and separated from each other by the predetermined distance 150. Alternatively, as illustrated in the cross section diagram of FIG. 3, the first conductor 121 in the exemplary pair 110b can similarly comprise a metal structure (e.g., a metal shape, line, pad, etc.) in a single metallization layer 163 on the chip. The second conductor 122 in the exemplary pair 110b can also be separated from the first conductor 121 by the predetermined distance 150. However, rather than being formed in a single metallization layer (e.g., 163), the second conductor 122 can comprise a conductor-filled via (e.g., a metal via) that extends vertically between that metallization layer 163 containing the first conductor 121 and at least one additional metallization layer (e.g., metallization layer 161) on the chip.

Figure 4:
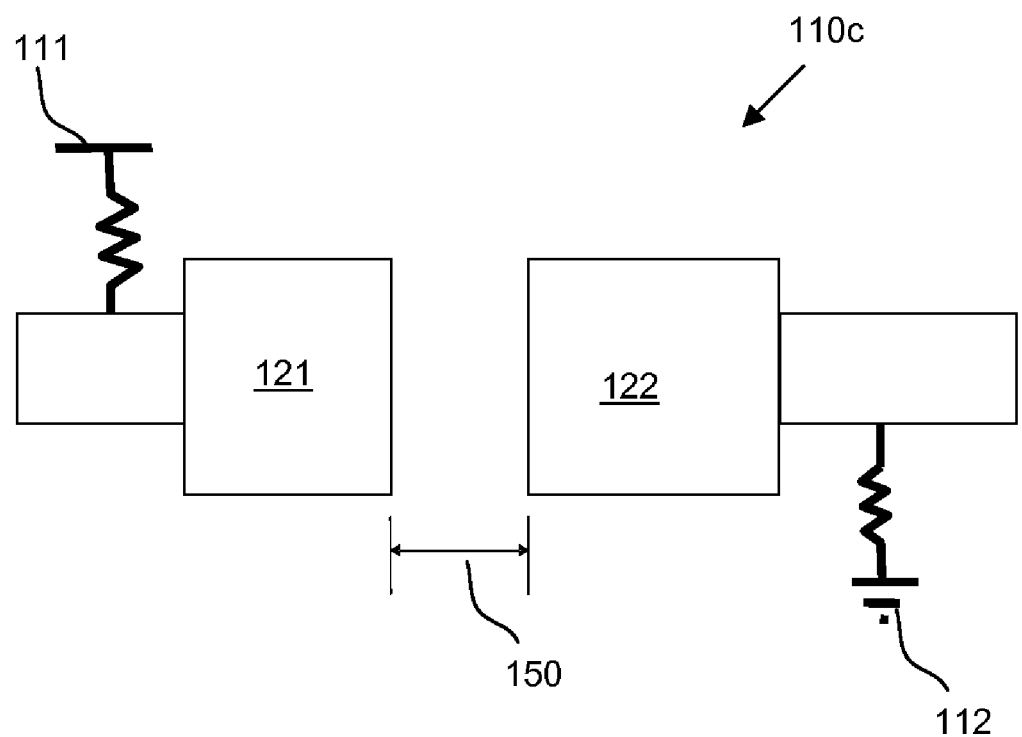
FIG. 4 is a top view diagram illustrating an exemplary configuration for a pair of conductors that can be incorporated into the identification circuit of FIG. 1.
Figure 5:
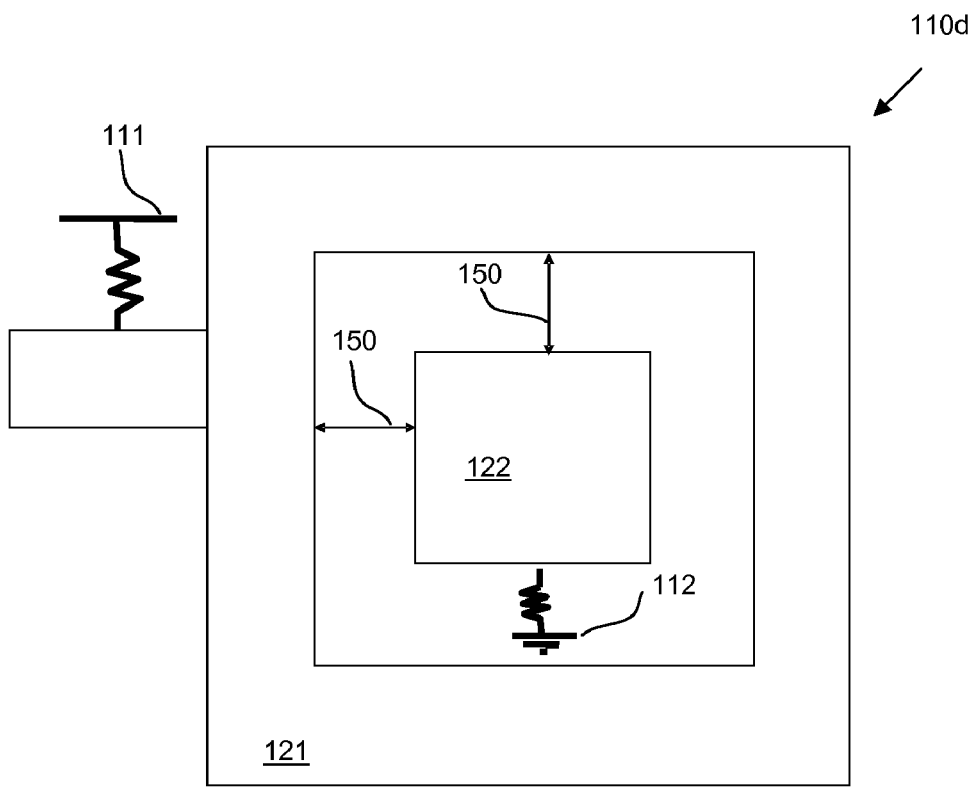
FIG. 5 is a top view diagram illustrating an exemplary configuration for a pair of conductors that can be incorporated into the identification circuit of FIG. 1.
Figure 6:
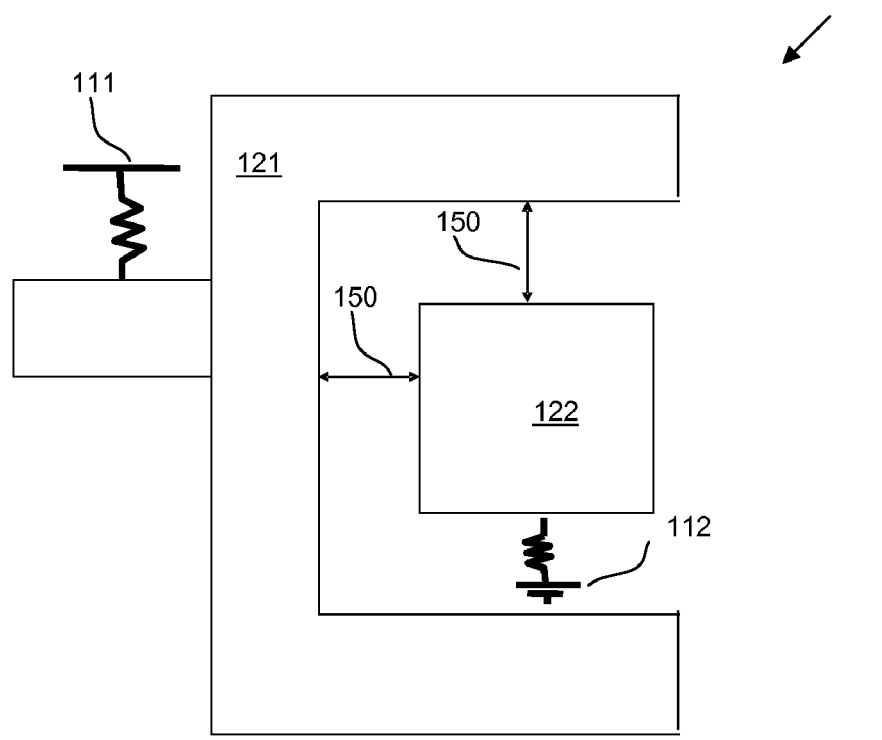
FIG. 6 is a top view diagram illustrating an exemplary configuration for a pair of conductors that can be incorporated into the identification circuit of FIG. 1.

Additionally, FIG. 4 is a top view diagram of an exemplary pair 110c of conductors. In this pair 110c, the first conductor 121 can be positioned adjacent to only one side of the second conductor 122. For example, in the pair 110c, the first and second conductors 121-122 can comprise metal pads formed in a single metallization layer and separated by the predetermined distance 150. Alternatively, FIGS. 5-6 are top view diagrams of exemplary pairs 110d and 110e of conductors. In pairs 110d and 110e, the first conductor 121 is formed as a metal line in a single metallization layer and the second conductor 122 is formed as a metal via that extends vertically between the metallization layer containing the first conductor 121 and at least one additional metallization layer. The first conductor 121 can either completely wrap around the second conductor 122 (see FIG. 5) or partially wrap around the second conductor 122 (see FIG. 6) such that at any given point where the first conductor 121 is adjacent to the second conductor 122, they are separated by the same predetermined distance 150.

The various exemplary pair configurations 110a-e, discussed above and illustrated in FIGS. 2-6, are offered for illustration purposes and are not intended to be limiting. Furthermore, the various exemplary pair configurations can be formed using conventional metallization techniques for forming metal shapes in one or more metallization layers.

Referring again to FIG. 1, this embodiment of the identification circuit 100 can further comprise a first voltage rail (e.g., a power source 111) to which the first conductor 121 in each pair 110.1-110.n is connected and a second voltage rail (e.g., ground 112) to which the second conductor 122 in each pair 110.1-110.n is connected. Thus, for each pair the first conductor 121 can comprise the drive side and the second conductor 122 can comprise the sense side. In operation, the power source 111 can pull up the first conductors 121 and ground 112 can pull down the second conductors 122. Those skilled in the art will recognize that pull-up resistor(s) 113 can be incorporated into the circuit 100 between the first conductors 121 and the power source 111 to limit the amount of current that can flow through the circuit 100. Similarly, pull-down resistor(s) 114 can be incorporated into the circuit 100 between the second conductors 122 and ground 112 to limit the current that can flow between the power source 111 and ground 112.

Figure 7:
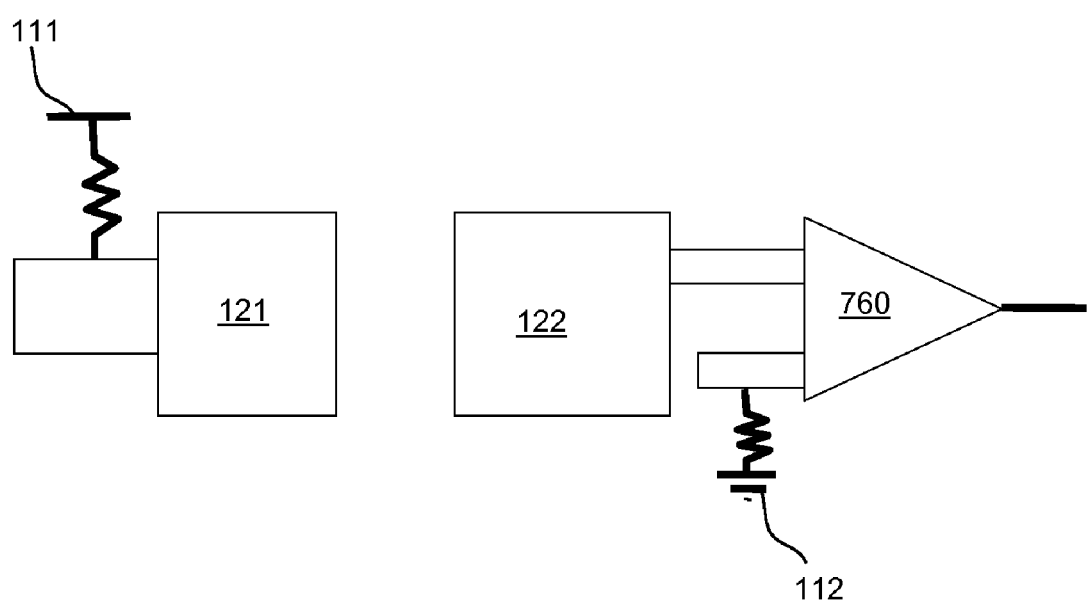
FIG. 7 is a diagram illustrating a sense amp incorporated into an identification circuit.

By pulling up the first conductors 121 and pulling down the second conductors 122, for any given pair 110 of conductors, if a short 131 exists the second conductor 122 will go high (i.e., have a logic value of 1) and if an open 132 exists, the second conductor 122 will go low (i.e., will have a logic value of 0). Using a sense amp as shown in FIG. 7 or other known techniques, the logic values (1 and 0) can be detected at each of the second conductors 122 for all of the multiple pairs 110 of conductors in order to capture a pattern of logic values (i.e., a bit pattern of 1's and 0's) associated with a particular on-chip identification circuit 100.

For example, each first conductor 121 in a given pair 110 can be connected to the output of a flop instead of VDD. This flop would indicate if the chip is capturing the on-chip identifier or private key at this time. That is, when the flop is driven to a logic of 1, the ID will be captured. When the logic value is a 0, the on-chip identifier or private key will not be captured. Additionally, each second conductor 122 in a given pair 110 can further be attached to one of the two data inputs of a 2:1 mux. The other data input of the 2:1 mux can be connected to a flop that holds the on-chip identifier or private key bit's value. The control for the 2:1 mux can come from the flop that is connected to the first conductor 121 for that given pair 110. When the ID value is needed, the controlling flop would be raised to logic 1 and this would raise the voltage on the first conductor 121. If a short exists, the voltage will be seen on the second conductor 122 and also at the associated input on the 2:1 mux. The 2:1 mux will steer this result to the on-chip identifier or private key bit flop where is will be captured. When the chip is not capturing the on-chip identifier or private key, then the ID bit flop will hold the value because the 2:1 mux will route the output of this flop back to the input.

Since the existence of a short in each pair 110 is random, chip-to-chip variability will cause different pairs to be open and different pairs to be shorted when comparing the resulting pattern of logic values from the same identification circuit 100 formed on different chips. That is, the pattern of logic values captured for one on-chip identification circuit 100 will be unique to that chip, as compared to the same on-chip identification circuit on another chip, due to chip to chip variability. Thus, this pattern of logic values can serve as either an on-chip identifier or a private key. To make the identifier or private key visible, it could be latched up and scanned out in the same manner as current fuse-based identification circuits. It should be noted that the identification circuit 100 can further comprise one or more switches for connecting the first conductors 121 to the power source 111 so that the pattern of logic values can be captured on demand, thereby, reducing power consumption by the identification circuit 100.

Additional features can be incorporated into this embodiment of the identification circuit 100 to prevent the pattern of logic values from changing over time and, thereby, to ensure the identification circuit's effectiveness for use in providing an on-chip identifier or private key. Specifically, the logic values that are detected at the second conductors 122 in each pair 110, and thus, the pattern of logic values for the circuit 100, can potentially change over time. This is because weak electrical connections that are initially detected as shorts 131 (i.e., weak shorts) have a tendency to degrade into opens 132 over time. For example, immediately after fabrication, a short 131 may be detected in a specific pair (e.g., 110.2) of conductors. However, if the electrical connection 131 between the first and second conductors 121-122 is weak (i.e., only minimal) over time it may degrade such that when the pattern is subsequently captured an open 132 is detected for that specific pair 110.2. Such pattern variation can be avoided, for example, by incorporating sense amps into the identification circuit, by incorporating duplicate sets of multiple pairs of conductors into the identification circuit, or by employing a burn-in process at test.

More specifically, one technique for avoiding pattern variations over time comprises incorporating sense amps into the identification circuit 100. For example, as illustrated in FIG. 7, for each pair of conductors, a sense amp 760 can be connected to the second conductor 122 and, specifically, to the second conductor 122 and ground 112 so that any electrical connection below a specified threshold is identified as an open (i.e., a logic value of 0) and not as a short (i.e., a logic value of 1). That is, if a sense amp 760 is used, only relatively strong electrical connections (i.e., electrical connections not subject to degradation into opens) will trip the sense amp 760 and, thus, only strong shorts are captured and exhibited in the pattern as a logic value of 1.

Another technique for avoiding pattern variations over time comprises performing a burn-in process (i.e., a training sequence) at test such that the pattern exhibited by the identification circuit 100 and used as the on-chip identifier or private key comprises a pattern of logic values that is captured following burn-in testing. Specifically, referring again to FIG. 1, during the burn-in testing process, a voltage is applied to first conductors 121 by the power source 111. This voltage is higher than the normal operating voltage and, more particularly, is sufficient to break any minimal electrical connections (i.e., sufficient to break weak shorts) between the first and second conductors 121-122 in each pair 110 of conductors. Thus, in any subsequently captured patterns only relatively strong electrical connections (i.e., strong shorts not broken during burn-in testing) are identified and represented by a logic value of 1.

Figure 8:
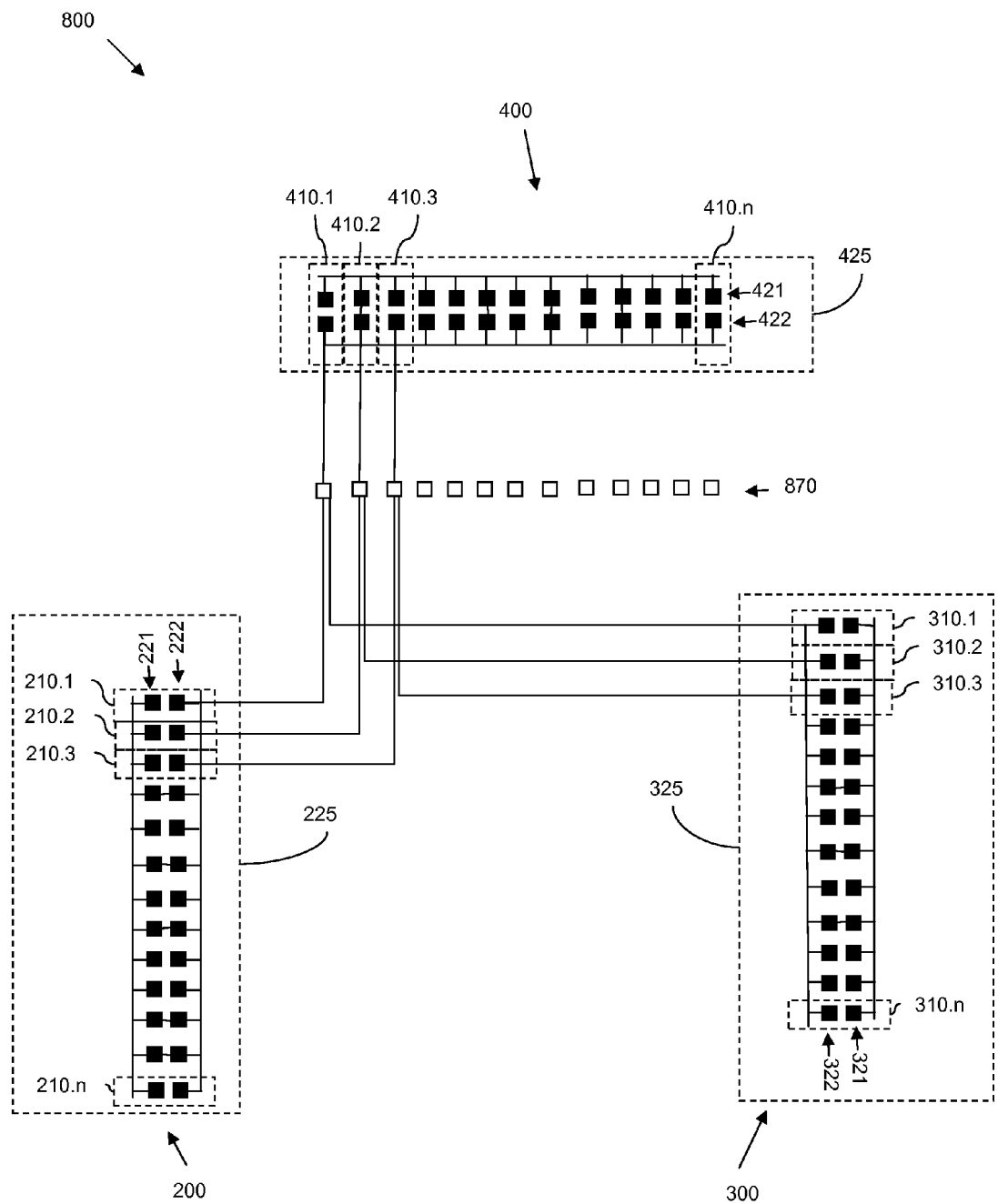
FIG. 8 is a diagram illustrating an embodiment in which multiple on-chip identification circuits are logically combined.

Finally, referring to FIG. 8, rather than using a single identification circuit 100, as described above and illustrated in FIG. 1, to generate the pattern of logic values for the on-chip identifier or a private key, another embodiment of an on-chip identification circuit 800 comprises multiple individual identification circuits 200, 300, 400 (in this case configured in the same manner as identification circuit 100 of FIG. 1). The multiple identification circuits 200, 300 and 400 can be placed across the chip and logically combined. Logically combining (e.g., XORing) the multiple identification circuits 200, 300, 400 to generate the pattern of logic values for the on-chip identifier or private key increases the randomness of the occurrence of 1's and 0's in the pattern of logic values and, thereby, further ensures the identification circuit's effectiveness for use in providing an on-chip identifier or private key.

More specifically, the embodiment 800 places multiple identification circuits 200, 300, 400 around the chip to take advantage of cross chip variation. Each of these circuits 200, 300, 400 can similarly comprise multiple sets 225, 325, 425 of multiple pairs 210, 310, 410 of conductors 221-222, 321-322, 421-422. The second conductors 222, 322, 422 of these multiple identification circuits 200, 300, 400 can then be combined in a logic circuit to create the pattern for the on-chip identifier or private key. For example, sets 225, 325 and 425 could all be combined in XOR gates 870 to create the pattern for the on-chip identifier or private key. Specifically, an XOR logic gate 870 can be connected between each corresponding second conductor 222, 322, 422 in each set 225, 325 and 425. Thus, the corresponding pairs of conductors 210.1, 310.1 and 410.1 would all be XORed together to form a unique value, the corresponding pairs of conductors 210.2, 310.2 and 410.2 would all be XORed together to form a unique value, and so on. For each XOR logic gate 870, a logic value of 1 will be output only if a logic value of 1 is detected at an odd number of the second conductors 222, 322, 422 feeding into that XOR logic gate 870. A logic value of 0 will be output only if the same logic value 1 is detected at an even number of second conductors 222, 322, 422 feeding into that XOR logic gate 870. Then, the pattern of logic values (i.e., bit pattern of 1's and 0's) output from all of the XOR logic circuits 870, rather than directly from each second conductor 222, 322, 422 in each circuit 200, 300, 400, can serve as an on-chip identifier or private key. The use of XOR logic gates 870, thereby, increases the entropy density per bit (i.e., per logic value) contained in the pattern.

Figure 9:
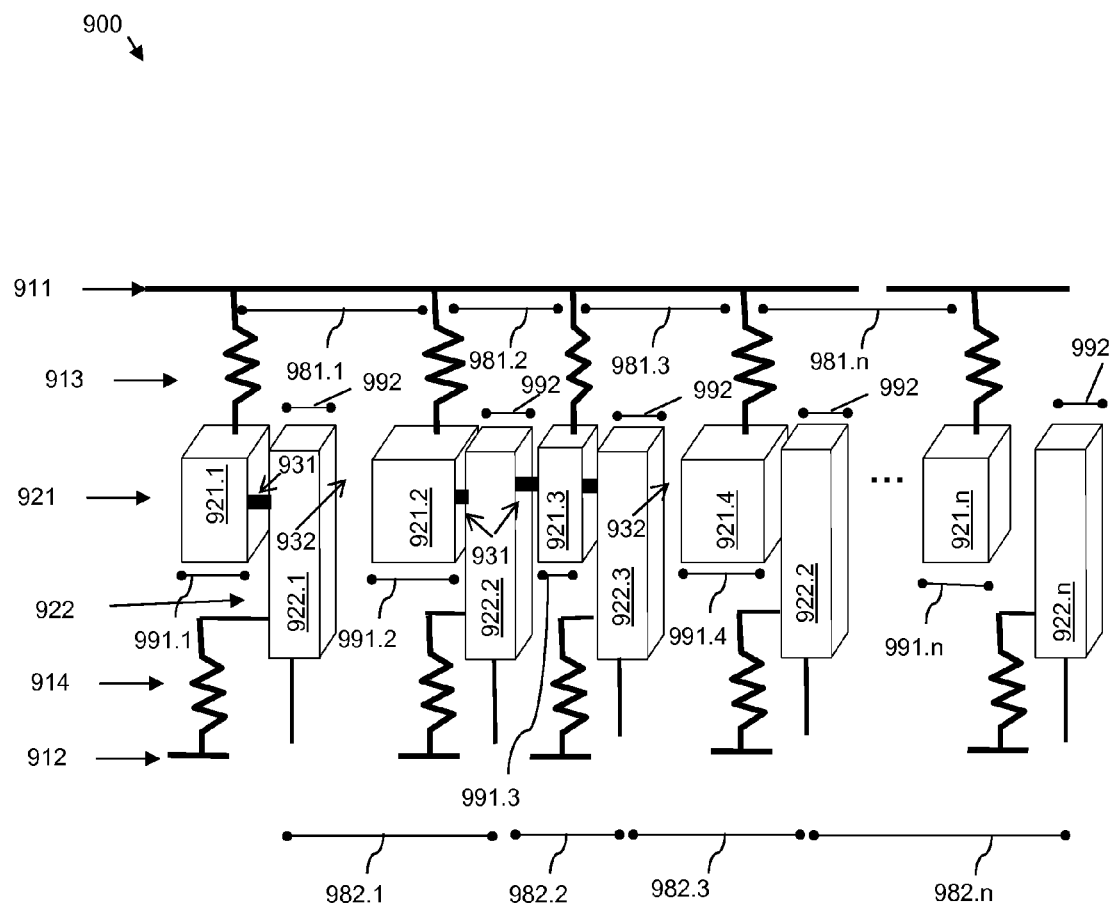
FIG. 9 is a diagram illustrating another embodiment of an identification circuit.

Referring to FIG. 9, another embodiment of an on-chip identification circuit 900 takes advantage of both known across chip line variations (ACLVs) and random mask alignment variations in order to provide an on-chip identifier or private key. This embodiment comprises a plurality of first conductors 921 (see first conductors 921.1-921.*n*) and a plurality of second conductors 922 (see second conductors 922.1-922.*n*). The first conductors 921 comprise metal lines in a single metallization layer on the chip. These metal lines have different widths (i.e., different first widths 991.1-991.*n*) and are separated by different distances (i.e., different first distances 981.1-981.*n*). The second conductors 922 comprise conductor-filled vias that extend vertically between the single metallization layer (i.e., the metallization layer in which the first conductors are positioned) and at least one additional metallization layer. These second conductors 922 similarly are separated by different distances (i.e., different second distances 991.1-991.*n*), but have the same width (i.e., a same second width 992).

The first conductors 921 and second conductors 922 are formed using separate masks (i.e., a first mask for forming the first conductors 921 and a second different mask for forming the second conductors 922) such that they are adjacent to each other and, more particularly, such that they alternate across the chip with each first conductor 921 adjacent to at least one second conductor 922. For example, first conductor 921.1 is adjacent to second conductor 922.1, first conductor 921.2 is adjacent to second conductors 922.1 and 922.2, and so on. Shorts 931 or opens 932 exist between adjacent first and second conductors 921-922. The identification circuit 900 takes advantage of moire patterns which result from mask alignment variations. More particularly, due to the different distances 981.1-981.*n* between the first conductors, the different widths 991.1-991.*n* of the first conductors, and the different distances 982.1-982.*n* between the second conductors and further due to random alignment variations between the masks used for forming the first and second conductors 921-922, each of the first conductors 921 has an approximately random potential to short to up to two of the second conductors 922. For example, as illustrated first conductor 921.1 shorts to one second conductor 922.1; however, first conductor 921.3 shorts to two second conductors 922.2 and 922.3, and so on.

As with the identification circuit 100, the identification circuit 900 can further comprise a first voltage rail (e.g., a power source 911) to which the first conductors 921 are connected and a second voltage rail (e.g., ground 912) to which the second conductors 922 are connected. Thus, the first conductors 921 are on the drive side of the circuit 900 and the second conductors 922 are on the sense side. In operation, the power source 911 can pull up the first conductors 921 and ground 912 can pull down the second conductors 922 so that, at any given second conductor 922, if a short 931 to one or more first conductors 291 exists, the second conductor 922 will go high (i.e., have a logic value of 1). Alternatively, if opens 932 to all adjacent first conductors 921 exist, the second conductor 922 will go low (i.e., will have a logic value of 0). A pattern of logic values detected at each of the second conductors 922 can serve as either an on-chip identifier or a private key. It should be noted that the identification circuit 900 can further comprise one or more switches for connecting the first conductors to the power source so that the pattern of logic values can be captured on demand, thereby, reducing power consumption by the identification circuit.

As with the previously described embodiment, several additional features can be incorporated into the embodiment of the identification circuit 900 in order to prevent the pattern from changing over time and, thereby, to ensure the identification circuit's effectiveness for use in providing an on-chip identifier or private key. Specifically, in the same manner as described above and illustrated in FIG. 7 with regard to identification circuit 100, the identification circuit 900 can incorporate sense amps. These sense amps can be connected to the second conductors 922 so that any electrical connection below a specified threshold is identified as an open 932 (i.e., a logic value of 0) and not as a short 931 (i.e., a logic value of 1). A burn-in process (i.e., a training sequence) can also be performed at test to break any minimal electrical connections (i.e., weak shorts). Thus, any pattern that is captured at the second conductors 922 following burn in testing and used as an on-chip identifier or private key will contain only relatively strong electrical connections (i.e., strong shorts) not subject to degradation into opens over time.

Finally, referring again to FIG. 8, rather than using a single identification circuit 900, as described above and illustrated in FIG. 9, to generate the pattern of logic values for the on-chip identifier or a private key, another embodiment of an on-chip identification circuit 800 comprises multiple individual identification circuits 200, 300, 400 (in this case configured in the same manner as identification circuit 900 of FIG. 9). The multiple identification circuits 200, 300 and 400 can be placed across the chip and logically combined. Logically combining the multiple identification circuits 200, 300, 400 to generate the pattern of logic values for the on-chip identifier or private key increases the randomness of the occurrence of 1's and 0's in the pattern of logic values and, thereby, further ensures the identification circuit's effectiveness for use in providing an on-chip identifier or private key. See detailed discussion of FIG. 8 above.

The identification circuit embodiments described above can provide a unique on-chip identifier with out the relatively large area requirements associated with fuses and without the additional time requirements necessary for blowing the fuses at test. For example, an identification circuit with 30 pairs of first and second conductors provides a 30-bit random value. 30-bit random values on each chip provide one billion unique logic values that can be used as on-chip identifier. Using 64 pairs of conductors in an identification circuit yields a less than 0.025% chance that two identification circuits on two different chips from among 100 million chips will have the same value. Additionally, using 128 pairs of conductors and XORing the pairs helps reduce any bias (e.g., more 1's than 0's). Currently a standard fuse takes up to approximately 7.3 $\mu m^2$ of chip area. However, metallization ground rules require that two lines in a metallization layer be separated from each other by a minimum distance to avoid a short. The minimum separation distance would require a conductor to take up an area of approximately 0.12 $\mu m^2$. Since approximately 60 lines or 30 pairs of first and second conductors can occupy the same area as one fuse (i.e., approximately 7.3 $\mu m^2$), 128 pairs of conductors will take up almost as much chip area as 4 fuses and will not require additional time for programming at test. Furthermore, the identification circuit embodiments described above can also provide a private key (i.e., a unique pattern of logic values) without requiring the use of random number generators based on thermal noise, meta-stability and/or radioactive elements.

Therefore, disclosed above are embodiments of improved on-chip identification circuitry. The disclosed embodiments take advantage of across chip line variations (ACLV) and, optionally, random mask alignment variations to provide a unique on-chip identifier and/or a private key. In one embodiment, pairs of adjacent conductors (e.g., metal pads, vias, lines, etc.) are formed within one or more of the chip metallization layers. The distance between the conductors in each pair is predetermined so that, given known ACLVs, there will be a random chance (i.e., an approximately 50% chance) that the conductors will short together. In another embodiment different masks can be used to form first conductors (e.g., metal lines), which are separated by varying distances and have different widths, and second conductors (e.g., metal vias), which are also separated by varying distances, but have approximately equal widths. The first and second conductors can alternate across the chip. Due to the different separation distances and the different widths of the first conductors, due to the different separation distances of the second conductors and, due to random mask alignment variations between the masks during fabrication, each of the first conductors has an approximately random potential to short to up to two of the second conductors. In each embodiment, a resulting pattern of shorts, as indicated by one logic value, and opens, as indicated by an opposite logic value, can be used as an on-chip identifier or private key.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. An identification circuit for a chip, said identification circuit comprising: multiple pairs of conductors on said chip, said pairs of conductors being electrically connected in parallel, and each of said multiple pairs of conductors comprising:
   a first conductor;
   a second conductor separated from said first conductor by approximately a specific distance; and between said first conductor and said second conductor, one of a short and an open, said specific distance being predetermined such that the occurrence of any one of said short and said open is possible between any one of said multiple pairs of conductors;
   a first voltage rail;
   a pull-up resistor connected to said first voltage rail, each said first conductor being electrically connected to said first voltage rail through said pull-up resistor;
   a second voltage rail;
   a pull-down resistor connected to said second voltage rail, each said second conductor being electrically connected to said second voltage rail through said pull-down resistor, each said first conductor being pulled up by said first voltage rail and each said second conductor being pulled down by said second voltage rail such that shorts and opens between said multiple pairs of conductors create a unique pattern of logic values that serves as one of an on-chip-identifier and a private key.

2. The identification circuit of claim 1, wherein, for any one of said multiple pairs of conductors, said short is indicated by a logic value of 1 detected at said second conductor and said open is indicated by a logic value of 0 detected at said second conductor.

3. The identification circuit of claim 1, further comprising at least one switch connecting each said first conductor to said first voltage rail only on demand.

4. The identification circuit of claim 1, wherein a logic value can be detected at said second conductor of each one said multiple pairs of conductors so as to create a unique pattern of logic values that serves as one of an on-chip identifier and a private key.

5. The identification circuit of claim 4, said pattern being detected at each said second conductor following burn-in testing.

6. The identification circuit of claim 1, said first conductor and said second conductor comprising metal structures in a single metallization layer on said chip.

7. The identification circuit of claim 1, said first conductor comprising a metal structure in a metallization layer on said chip and said second conductor comprising a conductor-filled via that extends vertically between said metallization layer and at least one additional metallization layer on said chip.

8. The identification circuit of claim 6, said metal structure at least partially wrapping around said conductor-filled via.

9. The identification circuit of claim 1, further comprising, for each of said multiple pairs of conductors, a sense amp connected to said second conductor so that an electrical connection below a specified threshold is identified as said open and not said short.

10. A chip comprising:
multiple identification circuits, each of said multiple identification circuits comprising: a same set of multiple pairs of conductors, said multiple pairs of conductors being electrically connected in parallel, and each of said multiple pairs of conductors comprising:
a first conductor connected to a power source;
a second conductor connected to ground and separated from said first conductor by approximately a specific distance;
and between said first conductor and said second conductor, one of a short and an open, said specific distance being predetermined such that the occurrence of any one of said short and said open is possible between any one of said multiple pairs of conductors;
and multiple logic gates, each one of said logic gates being connected a corresponding second conductor from each one of said multiple identification circuits and said multiple logic gates outputting a pattern of logic values that serves as one of an on-chip identifier and a private key.

11. The identification circuit of claim 10, further comprising: at least one switch electrically connecting each said first conductor to said power source only on demand.

12. The identification circuit of claim 10, said first conductor and said second conductor comprising metal structures in a single metallization layer on said chip.

13. The identification circuit of claim 10, said first conductor comprising a metal structure in a metallization layer on said chip and said second conductor comprising a conductor-filled via that extends vertically between said metallization layer and at least one additional metallization layer on said chip.

14. The identification circuit of claim 13, said metal structure at least partially wrapping around said conductor-filled via.

15. The identification circuit of claim 10, further comprising, for each of said multiple pairs of conductors, a sense amp connected to said second conductor so that an electrical connection below a specified threshold is identified as said open and not said short.

16. An identification circuit for a chip comprising:
a plurality of first conductors, said first conductors comprising metal structures in a metallization layer on said chip, being electrically connected in parallel, being separated by different first distances and having different first widths;
a plurality of second conductors adjacent to said first conductors, said second conductors comprising conductor-filled vias extending vertically between said metallization layer and at least one additional metallization layer on said chip, being electrically connected in parallel, being separated by different second distances and having a same second width, and said first conductors and said second conductors being positioned so as to alternate across said chip such that each of said first conductors is adjacent at least one of said second conductors; and
between each first conductor and each second conductor, one of a short and an open, said different first distances, said different first widths, said different second distances, and random mask alignment variations between a first mask used for forming said first conductors and a second mask used for forming said second conductors ensuring that each of said first conductors are randomly shorted to said second conductors.

17. The identification circuit of claim 16, further comprising:
a power source;
at least one switch connecting said power source to said first conductors; and
ground connected to said second conductors such that , at second conductor, a short to a first conductor is indicated by a logic value of 1 and an open to said first conductor is indicated by a logic value of 0.

18. The identification circuit of claim 16, wherein a logic value can be detected at said second conductor of each one said multiple pairs of conductors so as to create a unique pattern of logic values that serves as one of an on-chip identifier and a private key.

19. The identification circuit of claim 16, further comprising:
at least two duplicate sets of said first conductors and said second conductors; and logic circuits connecting corresponding second conductors, said logic circuits outputting a pattern of logic values output that serves as one of an on-chip identifier and a private key.

20. The identification circuit of claim 16, further comprising sense amps connected to said second conductors so that electrical connections below a specified threshold are identified as said opens and not said shorts.

* * * * *